US006486838B1

(12) United States Patent
Smith et al.

(10) Patent No.: US 6,486,838 B1
(45) Date of Patent: Nov. 26, 2002

(54) APPARATUS FOR AND METHOD OF NUCLEAR QUADRUPOLE RESONANCE TESTING A SAMPLE

(75) Inventors: John Alec Sydney Smith, London (GB); Michael David Rowe, London (GB)

(73) Assignee: BTG International Limited, London (GB)

(*) Notice: Subject to any disclaimer, the term of this patent is extended or adjusted under 35 U.S.C. 154(b) by 0 days.

(21) Appl. No.: 09/656,216

(22) Filed: Sep. 6, 2000

Related U.S. Application Data
(60) Provisional application No. 60/096,690, filed on Aug. 14, 1998.

(30) Foreign Application Priority Data

Mar. 6, 1998 (GB) ............................................. 9804931
Mar. 8, 1999 (WO) .............................. PCT/GB99/00680

(51) Int. Cl.[7] ................................................. H01Q 1/32
(52) U.S. Cl. ....................... 343/703; 343/867; 324/300; 324/314
(58) Field of Search ................................. 343/703, 741, 343/742, 866, 867, 895; 324/300, 307, 309, 314, 318

(56) References Cited

U.S. PATENT DOCUMENTS

| | | |
|---|---|---|
| 4,636,730 A | 1/1987 | Bottomley |
| 4,665,368 A | 5/1987 | Sugiyama et al. |
| 5,006,805 A | 4/1991 | Ingwersen |
| 5,578,920 A | 11/1996 | Kuster et al. |
| 5,592,083 A * | 1/1997 | Magnuson et al. .......... 324/300 |
| 6,054,856 A * | 4/2000 | Garroway et al. .......... 324/318 |
| 6,166,541 A * | 12/2000 | Smith et al. ................ 324/300 |

FOREIGN PATENT DOCUMENTS

| | | |
|---|---|---|
| EP | 0 692 721 | 1/1996 |
| WO | WO 96/26453 | 8/1996 |
| WO | WO 97/03366 | 1/1997 |
| WO | WO 98/19175 | 5/1998 |
| WO | WO 99/19740 | 4/1999 |

OTHER PUBLICATIONS

Niewadomski, "Filter Handbook: A Practical Guide", Heinemann Newnes, p. 152 (1989).

Suits B H et al., "Noise–Immune Coil for Unshielded Magnetic Resonance Measurements", Journal of Magnetic Resonance 131, 154–158 (1998).

Nelson W R, "Interference Handbook", Radio Publications Inc, 128–130 (1981).

Bosch C S et al., "Surface Coil Spectroscopy", NMR 27, Basic Principles and Progress, In–vivo Magnetic Resonance Spectroscopy 2: Localisation and Spectral Editing, 3–44 (1992).

Buess M L et al., "NQR Detection Using a Meanderline Surface Coil", Journal of Magnetic Resonance 92, 348–362 (1991).

(List continued on next page.)

Primary Examiner—Tho Phan
(74) Attorney, Agent, or Firm—Nixon & Vanderhye

(57) ABSTRACT

An apparatus for and a method of Nuclear Quadrupole Resonance testing a sample in the presence of interference are disclosed. The apparatus comprises excitation applying means for applying excitation, a first antenna for detecting a response to the excitation together with the interference, and a second antenna for detecting the interference, the first and second antennas being arranged such that a signal commonly detected in the two antennas is attenuated relative to a signal that is detected by only one of the antennas. The apparatus may provide suppression of interference.

21 Claims, 9 Drawing Sheets

OTHER PUBLICATIONS

Marino R A et al., "Multiple Spin Echoes in Pure Quadrupole Resonance" J. Chem. Phys 67, 3388–3389 (1977).

Choi K et al., Inductive Detection of piezoelectric resonance by using a pulse NMR/NQR spectrometer, Rev. Sci. Instrum 60, 3249–3252 (1989).

Decorps M et al., "An Inductively Coupled, Series–Tuned NMR Probe", Journal of Magnetic Resonances 65, 100–109 (1985).

Callaghan P et al., "NMR Studies on Antartic Sea Ice", Bulletin of Magnetic Resonance 18, 62–64, (1966).

Williams S R et al., "In vivo spectroscopy", Practical NMR Imaging, 249–274 (1987).

Young I R, "Advanced imaging techniques", Practical NMR Imaging, 199–248 (1987).

Marino R A et al., "Orthorhombic and Monoclinic TNT: A Nitrogen—14 NQR Study", Journal of Molecular Structure 111, 323–328 (1983).

Rowe M D et al., "Mine Detection by Nuclear Quadrupole Resonance", The Detection of Abandoned Land Mines: A Humanitarian Imperative Seeking a Technical Solution 431, 62–66 (1996).

Hirschfeld T et al., "Short Range Remote NQR Measurements", Journal of Molecular Structure 58, 63–77 (1980).

* cited by examiner

APPARATUS FOR AND METHOD OF NUCLEAR QUADRUPOLE RESONANCE TESTING A SAMPLE

This application claims benefit of application Ser. No. 60/096,690 filed Aug. 14, 1998.

The invention relates to an apparatus for and method of Nuclear Quadrupole Resonance testing a sample in the presence of interference.

BACKGROUND OF THE INVENTION

Nuclear Quadrupole Resonance (NQR) testing is used for detecting the presence or disposition of specific substances, such as polycrystalline substances. It depends on the energy levels of quadrupolar nuclei, which have a spin quantum number I greater than ½, of which $^{14}N$ is an example (I=1). $^{14}N$ nuclei are present in a wide range of substances, including animal tissue, bone, food stuffs, explosives and drugs.

In NQR testing, a sample is placed within or near to a probe comprising a radio-frequency (rf) coil and is typically irradiated with pulses or sequences of pulses of electromagnetic radiation having a frequency which is at or very close to one or more resonance frequency of the quadrupolar nuclei in a substance which is to be detected. If the substance is present, the irradiant energy will generate a precessing magnetization which can induce voltage signals in a coil adjacent the sample at the resonance frequency and which can hence be detected as a free induction decay (f.i.d.) during a decay period after each pulse or as an echo after two or more pulses.

SUMMARY OF THE INVENTION

The invention preferably relates to the testing of what are hereinafter termed "remote" samples. Although the following definition is not exclusive, remote samples are typically samples which lie outside the plane of the excitation/detection probe, often at a distance away from the probe which may be comparable with or greater than the largest cross-sectional dimension of the probe. With remote testing, it is often only possible to access the sample from one side, for instance if the sample is buried or concealed. Testing of remote samples which can only be accessed from one side is often termed "one-sided" testing; in such tests only the field from one side of the probe is utilised, the probe usually being shielded on the other side. Such a probe is referred to herein as an "open ended" probe.

More particularly, the invention relates to the detection of the presence of remote or other samples containing quadrupolar nuclei.

As an example, the present invention has particular application to the detection of $^{14}N$ quadrupole signals in drugs, such as cocaine and heroin, concealed on or within the person, possibly using a hand-held probe. As another example, the invention may find application in the detection of buried or concealed explosives, for instance in airport security monitoring. Again, in industrial processes, it can be used to detect signals from quadrupole-containing materials. Such materials might be proteins in foodstuffs, or quadrupole containing substances on conveyor belts, inside furnaces or nuclear reactors or in chemically or physically hazardous surroundings in which the probe must be located away from the remainder of the testing apparatus, possibly even on one side only of the system. The probe may be located inside the pressure vessel of the nuclear reactor, which may be at extremes of temperature and pressure.

Research carried out pursuant to the present invention has shown that conventional open ended probes have the disadvantage of being susceptible to interference. One type of interference is due to external sources producing rf spikes at random points in time. This causes the probe to produce bursts of rf signals at the frequency to which it is tuned. Large amplitude bursts may seriously corrupt the NQR signal since this may be less than the preamplifier noise base. Signal averaging may help to remove the effect of rf bursts, but this will increase the time taken for testing.

Another type of interference comes from more stable sources of rf energy at a single frequency, such as amplitude modulation (am) or frequency modulation (fm) radio transmissions. This type of signal may produce a line that could be confused with, or obscure, the NQR response.

Furthermore, in practical situations such as the detection of buried explosives or airport security monitoring, spurious interference may be generated by objects or matter surrounding or in the vicinity of the substance to be detected. Examples of such spurious interference are the piezoelectric signal generated in quartz, dry sand or soil by the electric field of the rf pulse, or the signal generated by ferromagnetic objects in response to the rf pulse. The spurious interference may be large enough to obscure or obliterate the NQR signal and to saturate the rf preamplifier and subsequent amplifiers.

The present invention aims to provide suppression of interference from whatever source. The interference may be any unwanted signal such as noise, and may originate from an external interfering source, or from the sample, as is the case with spurious interference, or from the NQR apparatus itself.

According to one aspect of the present invention there is provided an apparatus for Nuclear Quadrupole Resonance testing a sample in the presence of interference comprising excitation applying means for applying excitation, a first antenna for detecting a response to the excitation together with the interference, and a second antenna for detecting the interference, the first and second antennas being arranged such that a signal commonly detected in the two antennas is attenuated relative to a signal that is detected by only one of the antennas.

The response signal will normally be detected mainly in one antenna, while the interference will normally be detected in both antennas, and hence the apparatus according to the invention can afford the advantage that interference may be attenuated or cancelled.

In order to ensure that large spurious interference, which could potentially overload the testing apparatus, does not reach the antennas, the apparatus preferably comprises a screen located adjacent the first antenna, the screen being arranged to attenuate the electric component of an rf signal passing through it relative to the magnetic field component. For example, the screen may comprise one or more layers of a non-ferromagnetic metal such as aluminium or copper, or one or more layers of metallised plastic.

In order to prevent eddy currents from forming in the screen, which may cause the Q of the antenna to drop, the screen may be slotted. Preferably, the screen has a slot extending from its centre to its edge, although other slotting arrangements may be used.

The screen may be any suitable shape; in one preferred example the antenna is annular with a slot from the centre to the edge.

The apparatus preferably comprises a second screen, similar to the first screen, located adjacent the second antenna. This may help to ensure that the Q's of the two antennas are as closely matched as possible.

In order to reduce further any spurious interference, the excitation applying means is preferably adapted to apply phase cycled pulse sequences, preferably according to the doctrine of phase equivalence as taught in U.S. Pat. No. 6,208,136 in the name of British Technology Group Limited, the subject matter of which is incorporated herein by reference.

Hence the apparatus may be for Nuclear Quadrupole Resonance testing a sample containing quadrupolar nuclei and which may give rise to spurious signals which interfere with response signals from the quadrupolar nuclei, in which case the excitation applying means may be adapted to apply a pulse sequence to the sample to excite nuclear quadrupole resonance, the pulse sequence comprising at least one pair of pulses, and the apparatus may further comprise means for comparing, for the or each such pair, the respective response signals following the two member pulses of the pair, the pulse sequence being such that the respective spurious signals following the two member pulses can be at least partially cancelled by the comparing means without the true quadrupole resonance signals being completely cancelled, and for the or each such pair, the two member pulses being of like phase. The sample may comprise a substance containing quadrupolar nuclei which may itself give rise to spurious signals, or the sample may comprise a first type substance containing quadrupolar nuclei and a second type substance which may give rise to the spurious signals.

For the or each such pair of pulses, a respective pulse preceding each member pulse of the pair may be of differing phase. The or each such pair of pulses may be of a first type, and the pulse sequence may further comprise at least one further second type pair of pulses, corresponding to the or each first type pair, but having cycled phases.

The excitation applying means may comprise an additional antenna for applying the excitation. However, preferably at least the first antenna is adapted to apply excitation. This can reduce the size and complexity of the apparatus.

The second antenna may also be active, that is, it may be adapted to apply additional excitation and to detect a response to that excitation. This may provide the advantage of allowing twice the area to be tested at any one time than would be possible if only the first antenna were active. Having both antennas active may also provide the advantage of reducing spurious interference, particularly in the case where the object or matter causing the spurious interference is in the field of view of both antennas.

In one preferred embodiment, the first antenna comprises a first coil and the second antenna comprises a second coil, the first and second coils being wound in the opposite sense to each other. The two coils may be connected in series or in parallel.

In another preferred embodiment, the first antenna is coupled to the second antenna via a balanced bridge circuit. This may allow the relative orientation and distance apart of the two antennas to be adjusted, and may also allow the two antennas to be more accurately balanced than in the case where the two antennas are directly connected.

In a further preferred embodiment the first antenna is coupled to the second antenna by a comparator circuit, for example an operational amplifier, or any other type of comparator.

Means may be provided for adjusting the relative orientation of the first and second antennas, to allow the common mode rejection of the two antennas to be optimized.

According to a closely related aspect of the invention there is provided a method of Nuclear Quadrupole Resonance testing a sample in the presence of interference comprising applying excitation to the sample, detecting a response to the excitation together with the interference to yield a first signal comprising a response component and an interference component, detecting the interference to yield a second signal, and combining the first signal and the second signal such that the interference component is attenuated relative to the response component.

The method may further comprise applying additional excitation and detecting a response to said additional excitation together with the interference to yield said second signal.

The interference may comprise spurious interference from ferromagnetic or piezoelectric materials.

The method may be a method of Nuclear Quadrupole Resonance testing a sample containing quadrupolar nuclei and which may give rise to spurious signals which interfere with response signals from the quadrupolar nuclei, in which case the step of applying an excitation signal may comprise applying a pulse sequence to the sample to excite nuclear quadrupole resonance, the pulse sequence comprising at least one pair of pulses, and the method may further comprise comparing, for the or each such pair, the respective response signals following the two member pulses of the pair, the pulse sequence being such that the respective spurious signals following the two member pulses can be at least partially cancelled by the comparison without the true quadrupole resonance signals being completely cancelled, and for the or each such pair, the two member pulses being of like phase. The sample may comprise a substance containing quadrupolar nuclei which may itself give rise to spurious signals, or the sample may comprise a first type substance containing quadrupolar nuclei and a second type substance which may give rise to the spurious signals For the or each such pair of pulses, a respective pulse preceding each member pulse of the pair may be of differing phase. The or each such pair of pulses may be of a first type, and the pulse sequence may further comprise at least one further second type pair of pulses, corresponding to the or each first type pair, but having cycled phases.

The second signal may be detected in a different environment from the first signal. The method may be carried out in the absence of an applied magnetic field.

BRIEF DESCRIPTION OF THE DRAWINGS

Preferred features of the present invention will now be described, purely by way of example, with reference to the accompanying drawings, in which.

DETAILED DESCRIPTION OF PREFERRED EMBODIMENTS

In order to suppress interference in an NQR testing apparatus, a probe is provided having two antennas. The antennas are arranged so as to provide common mode rejection, that is, a signal that is commonly detected in the two antennas is attenuated relative to a signal that is detected by only one of the antennas.

First Preferred Embodiment

In a first preferred embodiment, a probe for NQR testing comprises two antennas, each consisting of a coil wound in the opposite sense to the other coil, and connected so as to provide common mode rejection.

Figure 1:
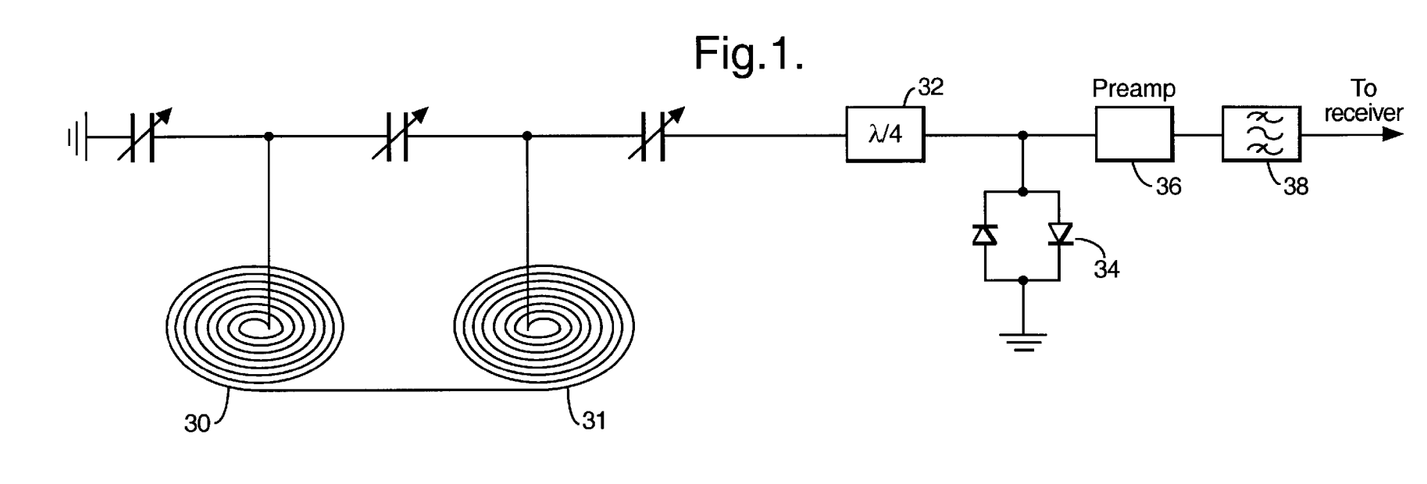
FIG. 1 shows part of a probe according to a first variant of a first preferred embodiment.

FIG. 1 shows part of a probe according to one variant of the first preferred embodiment. The probe consists of a first spiral coil 30 wound in one sense and a second spiral coil 31 wound in the opposite sense, connected such that signals which are commonly detected in the two coils cancel out or are attenuated.

In this particular embodiment, the coils are made out of insulated copper wire of about 3 mm total diameter and 1.1 mm conductor diameter. They are wound between 2 squares of 6 mm thick Perspex (trademark) spaced 3 mm apart. The inside diameter is about 1.5 cm and the outside diameter about 10 cm, and there are 14.75 turns.

Each coil uses 3.27 metres of wire including connecting leads at each end. The coils are placed 3 cm apart, although other configurations are possible.

The coils are tuned and matched using capacitors. In this example there are two matching capacitors: one between the two coils and one from the second coil to ground. This makes the coils more symmetric about a virtual ground which makes the probe less sensitive to ground loop interference. The output of the coils is fed, via a quarter wavelength circuit 32 and crossed diodes to ground 34, to a preamplifier circuit 36, which in this case was two Miteq (trademark) preamplifiers. The output of the preamplifier circuit is filtered by a bandpass filter 38 to further reduce interference and then fed to a receiver (not shown).

Figure 2:
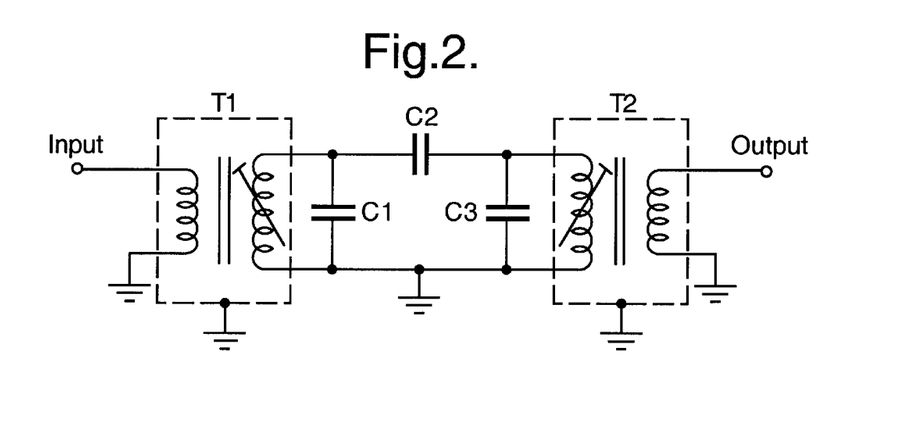
FIG. 2 shows an example of a filter for use with the first preferred embodiment.

A suitable circuit for the filter 38 is shown in FIG. 2. Referring to FIG. 2, the capacitors C1 and C3 tune the two circuits, and C2 is chosen for critical coupling. The filter may be modified by the addition of two sets of crossed diodes in parallel with C1 and C3 to produce a peak limiting filter. This may help to reduce large interference spikes. Additional filters may be located before the preamplifier or elsewhere in the signal path, for example in the receiver.

In operation, the coils are arranged so that one coil picks up the NQR response signal, along with interference, while the other coil picks up as little as possible of the response signal, while still picking up substantially the same interference. The coils are sufficiently separated to ensure that the NQR response is detected mainly by one coil, but sufficiently close to ensure that the interference signals picked up by both are as similar as possible. The size and arrangement of the coils will therefore depend in a large part on the size and location of the sample to be detected, and are not limited to the values given above. In general the coils will be separated by a distance larger than the expected size of the sample to be detected but small enough that any interference source generates substantially the same signal in the two. The relative orientation of the two coils may need to be adjusted to optimize the common mode rejection. The coils themselves will be proportioned in relation to the expected sample size.

Although a series connection is shown in FIG. 1, a parallel arrangement could also be used, with the appropriate connections and matching so that the signals in the two coils cancel out.

Figure 3:
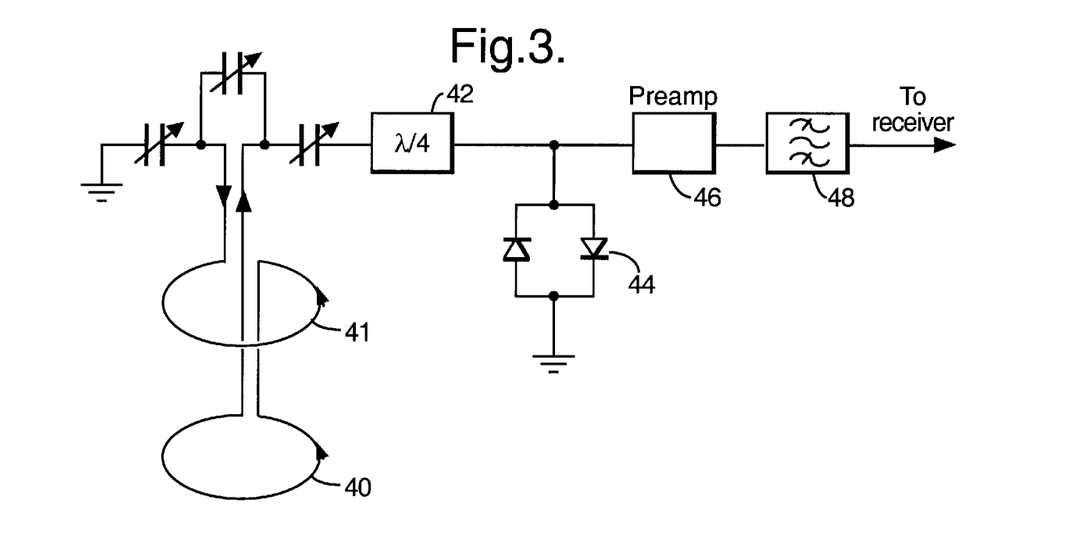
FIG. 3 shows a part of a probe according to a second variant of the first preferred embodiment.

FIG. 3 shows an arrangement according to another variant of the first preferred embodiment. In this case each antenna consists of a coil having a single turn, and the two coils are located one above the other. In this case both coils are shown as being the same size, although other configurations are possible; for example the upper coil may be larger than the lower coil. The coils are arranged so that one coil (in this case the lower coil) detects the NQR signal while both coils detect interference. The coils are connected such that commonly detected interference is attenuated. The coils are connected to the receiver circuit via a quarter wavelength circuit, crossed diodes to ground, a preamplifier circuit and a filter in the same way as described with reference to FIG. 1.

It should be noted that any type of antenna, for instance planar spiral coils, solenoids, tilted solenoids, single turn coils, Helmholz coils (typically a pair of parallel coils separated by a distance equal to their ratios), loop gap resonators or split resonators could be used. The coils need not be circular but may be rectangular spirals or any other convenient shape (not necessarily spiral). The coils may be either in one plane, or contoured, for instance so as to partly surround a sample. The two antennas need not necessarily be the same size or shape.

It is possible to make the two antennas active, that is, both antennas may be used for both transmitting excitation signals and receiving response signals. As long as the sample being searched for is small compared to the field of view of each antenna, both antennas will excite and collect NQR signals with a small risk of real signals being cancelled between the antennas. This arrangement may increase the area that can be scanned within a given time, and may provide some cancellation of spurious interference such as the soil piezoelectric signal.

Large spurious interference may be reduced by suitable shielding to attenuate the electric field component of the rf signals while still allowing the magnetic field component to reach the sample. Generally, a screen consisting of a layer of non-ferromagnetic metal will serve this purpose. Suitable materials are aluminium, copper and "anti-static" metallised plastic. The screen is located between the sample and the detection coil to reduce the electric field component of rf signals reaching the coil. The thickness of the metal screen is preferably of the same order of magnitude as the skin depth of the material to avoid attenuating the magnetic component of the rf field as well as the electric component. The skin depth of aluminium at 5193 kHz is 37 $\mu$m and that of copper is 291 $\mu$m.

It is desirable to locate the screen as close as possible to the coil in order to avoid increasing the coil-to-sample distance, but having the screen too close to the coil may reduce the coil Q. It has been found that slots in the screen may reduce eddy currents in the screen and allow the screen to be placed relatively close to the coil without significantly increasing the coil Q. A radial slot from the outside edge of the screen through to the point coincident with the coil axis has been found to be most effective.

A suitable screen arrangement has been found to be four layers of "anti-static" metallised plastic with a 2 mm slot from the edge of the screen to the point of the coil axis. Another suitable arrangement is a layer of 145 μm or 115 μm thick aluminium foil in the same configuration. The screen would normally be located as close as possible to the detection coil without significantly reducing the coil Q; in experiments distances of between 2.5 cm and 4.5 cm between the coil and the screen were used, although other distances could also be used. Any suitable shape of screen could be used. For example the screen may be square, circular or annular, in each case preferably with a radial slot. A slotted annular screen was found to give the least reduction in Q.

Preferably both antennas have shielding means associated with them to ensure that the Q's of the two antennas are as closely matched as possible, although it is possible for just the active antenna to have shielding means associated with it. In either case the shielding means is preferably grounded, and may be passive or active. Additional Q matching of the two antennas may be necessary to compensate for different $B_1$. cases, due for example to terrain differences.

Any type of pulse sequences may be used with the probe of the first embodiment, although preferably phase cycled pulse sequences are used to provide further rejection of spurious signals. Phase cycled pulse sequences will be described later.

Experimental Results

Figure 4:
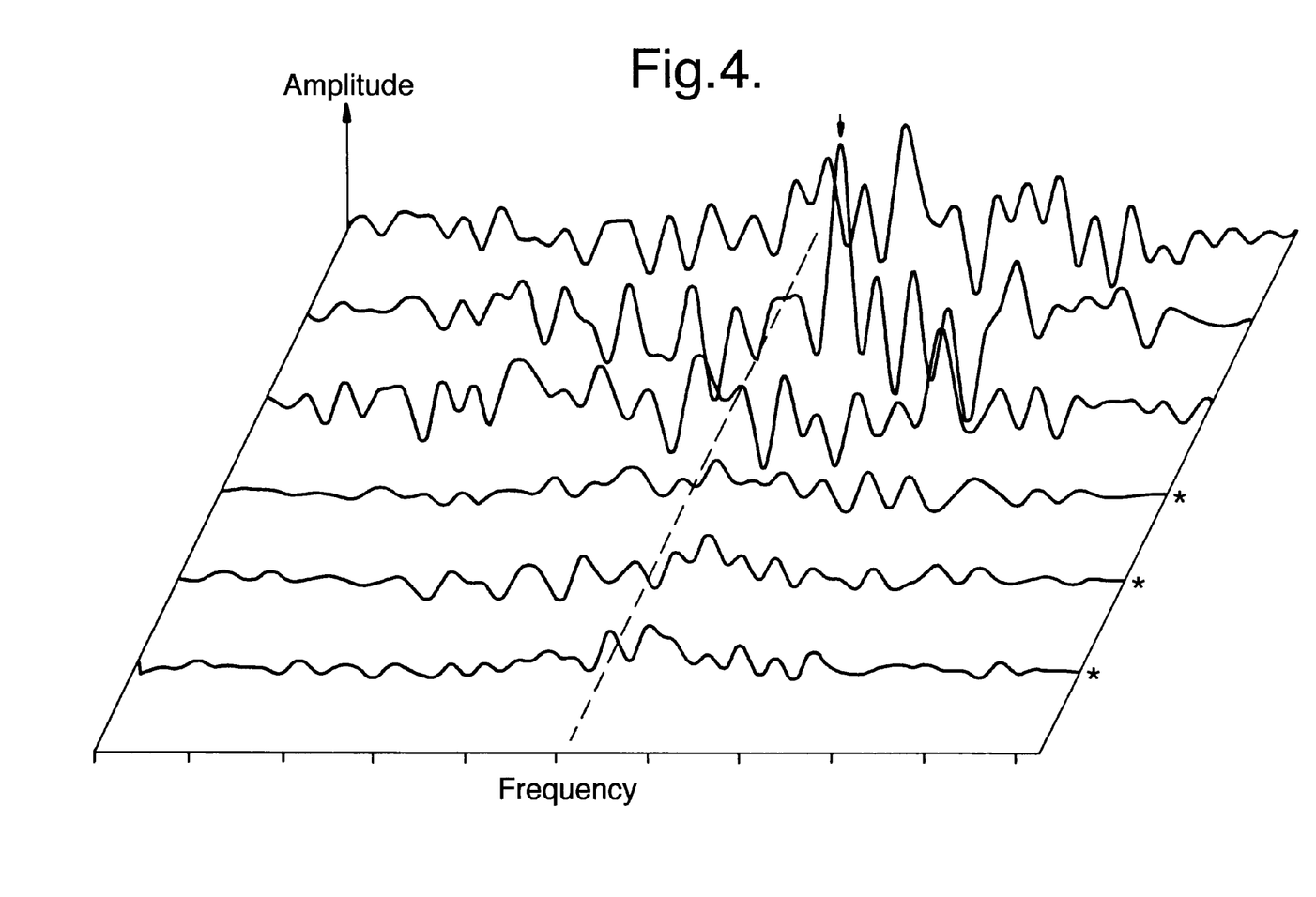
FIG. 4 shows results obtained with the probe of the first preferred embodiment.

FIG. 4 shows a stacked plot of the signals from a two coil probe of Q-factor 144 in the absence of a sample. The upper three plots are for an unscreened probe and the lower (marked with an asterisk) for a screened probe. In this experiment the screen was made from 115 μm thick aluminium foil with a 10 cm hole in the centre, slotted radially to one edge, and the screen was placed at 2.5 cm from the coil. It can be seen that there is considerably less interference with the screened probe. One hundred accumulations were taken and the mean ratio of the unscreened to screened RMS noise was found to be 3.5. With a single spiral coil and the same number of accumulations the corresponding ratio was about 15. Use of a two coil probe and a screen can therefore result in interference rejection of over four-fold in comparison to the single coil unscreened probe.

Second Preferred Embodiment

In the second preferred embodiment, a second antenna is connected to an excitation/detection antenna by means of an rf bridge circuit.

Figure 5:
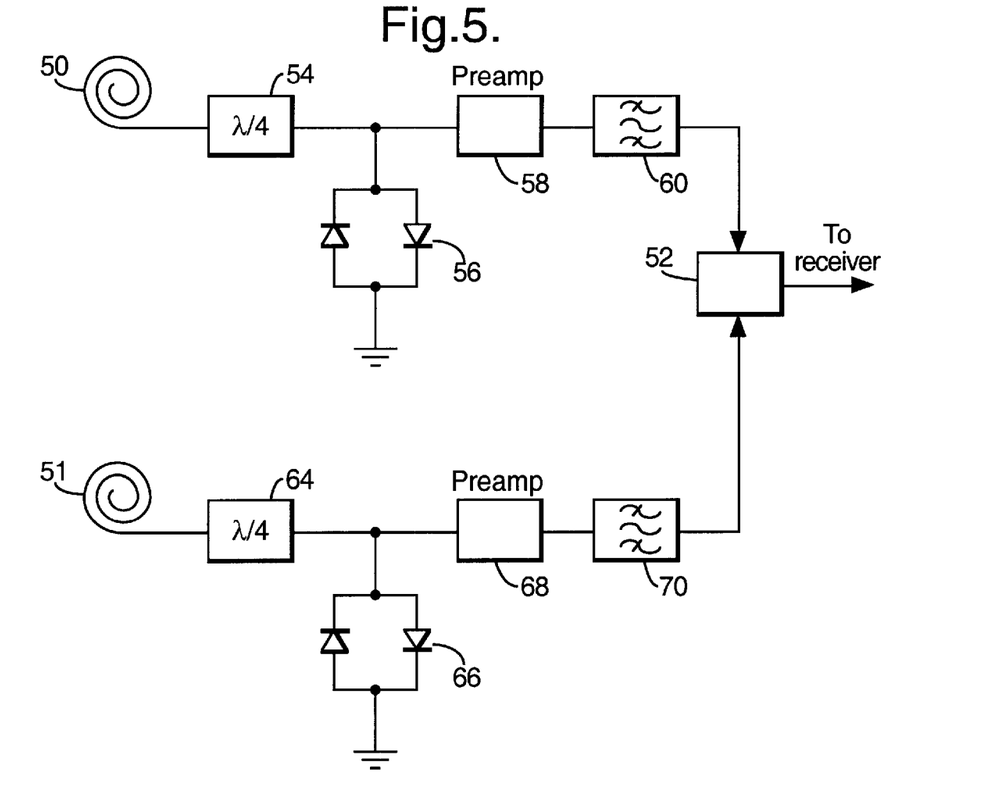
FIG. 5 shows part of a probe according to a second preferred embodiment.

Referring to FIG. 5, a first spiral coil 50 is set up as a transmit/detection antenna and a second spiral coil 51 is set up next to the first (active) coil 32 as an interference pickup antenna. In this example the two coils are in parallel planes with a distance of about 20 cm between the two planes, and the axes of the coils are about 50 cm apart. This orientation may need to be adjusted, for instance to optimize the common mode rejection. It should be noted that these values are given purely as an example, and any appropriate size and orientation of the antennas may be used, as discussed with reference to the first preferred embodiment.

The signal from the first coil 50 is fed into the signal input of an rf bridge circuit 52, via a λ/4 unit 54, two crossed diodes to ground 56, 2 Miteq (trademark) preamplifiers 58 and a band pass filter 60. The two crossed diodes to ground 56 are used for protection and limit the input to the preamplifiers to about 2V peak-to-peak. The signal from the interference antenna is fed, via a λ/4 unit 64, crossed diodes to ground 66, 2 Miteq (trademark) preamplifiers 68 and a band pass filter 70, into the noise input of the bridge 52. The output of the bridge circuit is fed to the receiver (not shown). The filters 60,70 may be of the type shown in FIG. 2.

Figure 6:
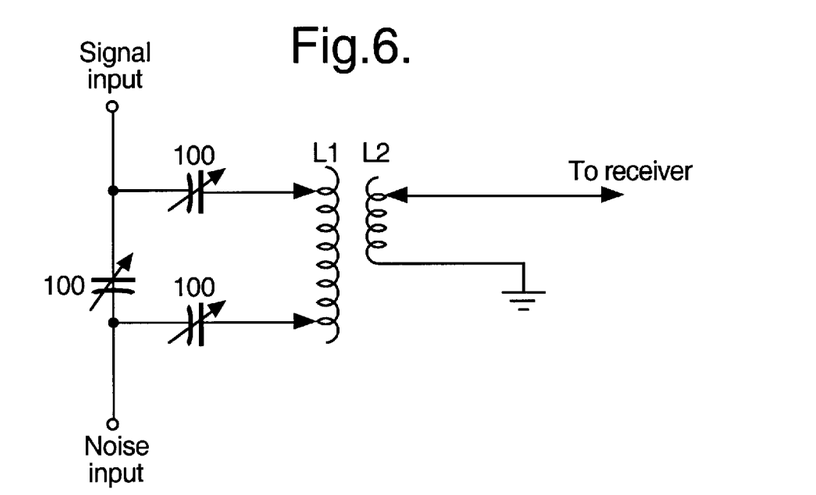
FIG. 6 shows a first example of a bridge circuit for use with the second preferred embodiment.
Figure 7:
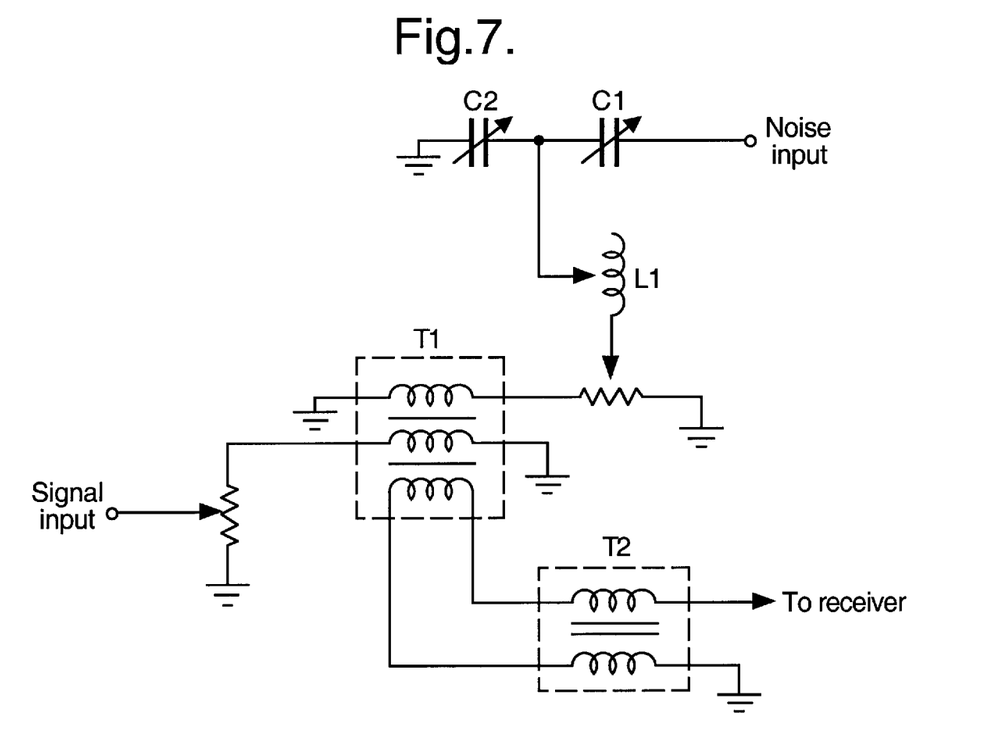
FIG. 7 shows a second example of a bridge circuit for use with the second preferred embodiment.

Suitable rf bridge circuits are shown in FIGS. 6 and 7. FIG. 6 shows a simple noise balancing bridge. Coil L1 is ten turns, 2.2 cm in diameter and 5 cm long. Coil L2 is five turns, clockwise wound around the centre of L1. Taps and capacitors are adjusted for minimum noise. FIG. 7 shows a more sophisticated noise balancing bridge. C1 and C2 are 300–400 pF air capacitors. Coil L1 is 32 turns of 0.71 mm diameter enamel wire wound on a Perspex (trademark) former. T1 and T2 are wound with 0.71 mm enamel wire on ¾ inch (1.875 cm) diameter toroidal ferrite cores. Usual precautions are taken to prevent pick-up between the various input and output lines. In both cases the bridge circuit needs to be carefully balanced to ensure optimum cancellation.

Any other suitable bridge circuit could be used instead of those shown in FIGS. 6 and 7. For example, the ANC-4 antenna interference canceller manufactured by JPS Communications Inc. in the USA and marketed in the UK by LOWE Electronics could be used. This circuit is an active device which therefore requires a power supply, but may give better results. Alternatively, any type of comparator circuit such as an operational amplifier comparator could be used in place of the bridge circuit.

In use the antennas may be co-mounted and both may be moved across the area of interest, or alternatively the interference pick-up antenna may be stationary and just the active antenna may scan the area of interest.

If the two antennas are to scan the area of interest then, as in the first preferred embodiment, both antennas may be made active, that is, both antennas may be used for both transmitting excitation signals and receiving response signals. This arrangement may increase the area that can be scanned within a given time, and may provide some cancellation of spurious interference such as the soil piezoelectric signal and even probe ringdown.

As in the first preferred embodiment, shielding means may be located across the open end of the probe to reduce spurious interference. Any of the screens described with reference to the first preferred embodiment may be used with the second preferred embodiment. The shielding means may be across one or both of the antennas.

In the second preferred embodiment, as in the first, any appropriate type of antenna, not necessarily spiral coils, may be used. The antennas need not be of the same type. For example, a short antenna and tuned circuit combination could be used as an interference pick-up source instead of the interference antenna, which may allow a more compact design.

Any type of pulse sequences may be used with the probe of the second embodiment, although preferably phase cycled pulse sequences are used to provide further rejection of spurious signals. Phase cycled pulsed rf sequences will be described later.

Experimental Results

Figure 8A:
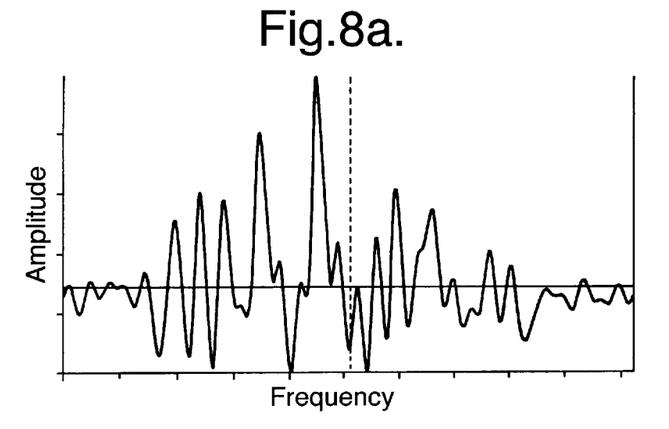
FIGS. 8a–8c and FIGS. 9a–9c shows some results obtained with the probe of the second preferred embodiment.
Figure 8B:
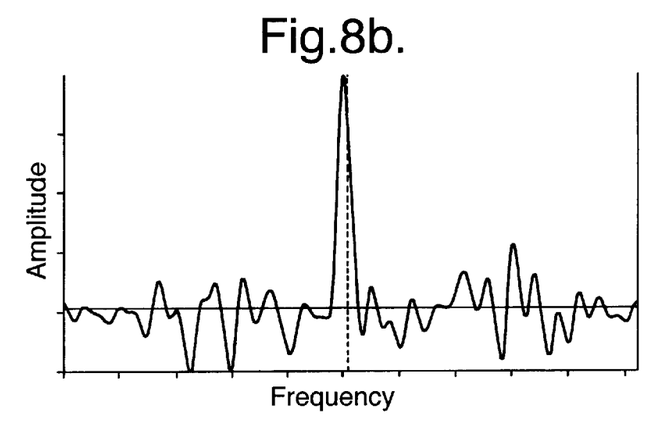
Figure 8C:
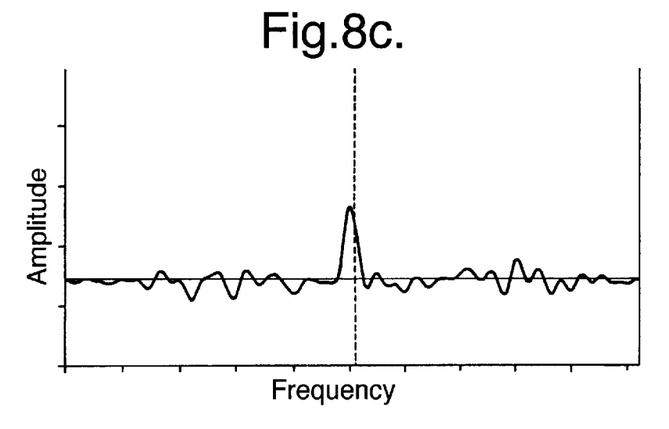

Tests were carried out on a probe using the bridge circuit shown in FIG. 7. A 1 kg sample of the explosive PE-4 (RDX) was located with its centre at 15.5 cm from the coil of the detecting antenna Pulse lengths used were 300 μs, approximately $t_p$, (119°). FIG. 8a shows the signal obtained from the system recorded with 20 data accumulations and with the interference pick-up antenna lead disconnected from the bridge. As can be seen from FIG. 8a, interference completely obscures the response signal at 5193 kHz. FIG. 8b shows the signal obtained with the bridge balanced, that is, with the interference pick-up antenna reconnected. As can be seen from FIG. 8b, the NQR signal is clearly detected with a SNR≈9. FIG. 8c shows the same signal as in FIG. 8b but plotted on the same scale as FIG. 8a for comparison.

Figure 9A:
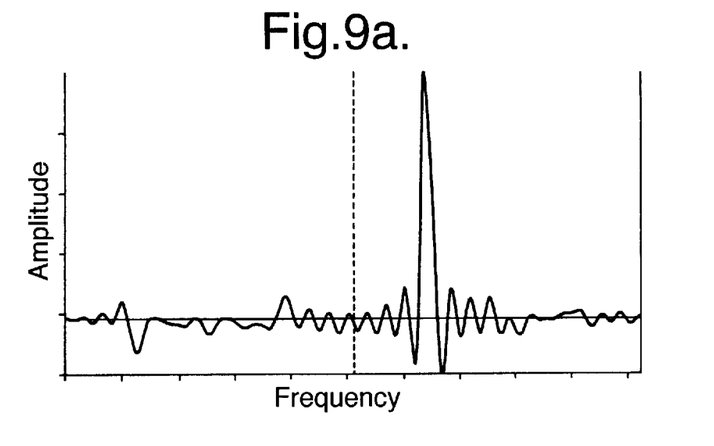
Figure 9B:
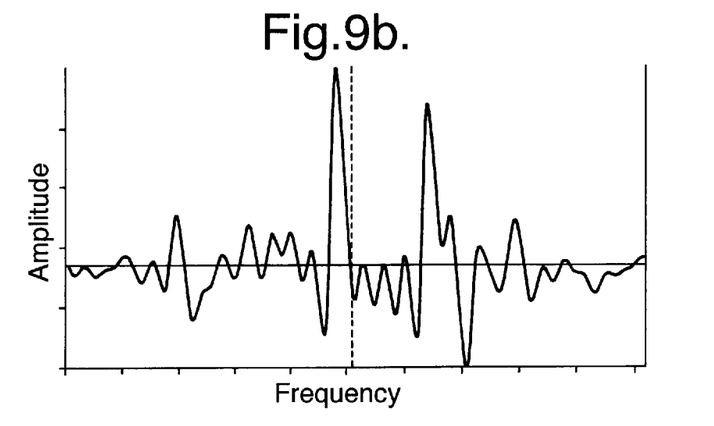
Figure 9C:
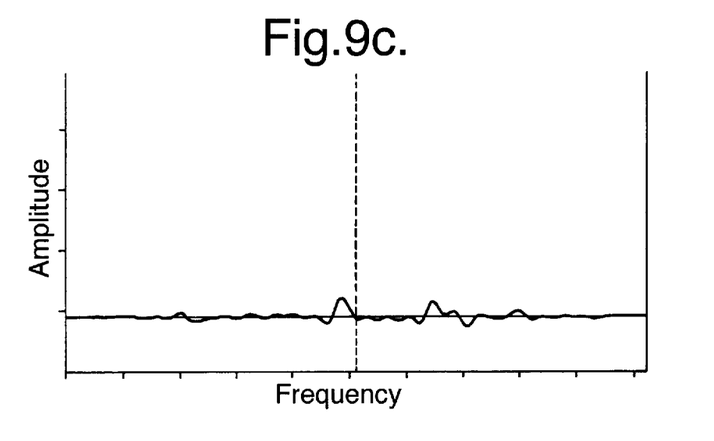

As a further test a signal generator was set up with its output connected to a short vertical aerial wire positioned roughly 1.2 m horizontally from the centre of the two antennas. The signal generator was set at 5195 kHz, which is about 2 kHz from the resonance to be detected and well within the pass band of the filters in the rf signal line. FIG. 9a shows the signal obtained from the system with 20 data accumulations and with the interference antenna disconnected from the bridge: the 5195 kHz signal overwhelms all other features. The lead from the interference antenna was reconnected to the bridge, which was then balanced to minimize the 5195 kHz signal. FIG. 9b shows the signal recorded with this set up. The NQR response signal is clearly detected as the biggest peak; the signal from the signal generator is still present but is reduced by a factor of about 14. The reduction is emphasised in FIG. 9c which is the signal of FIG. 9b on the same scale as FIG. 9a.

Preferred Embodiment of Apparatus

Figure 10:
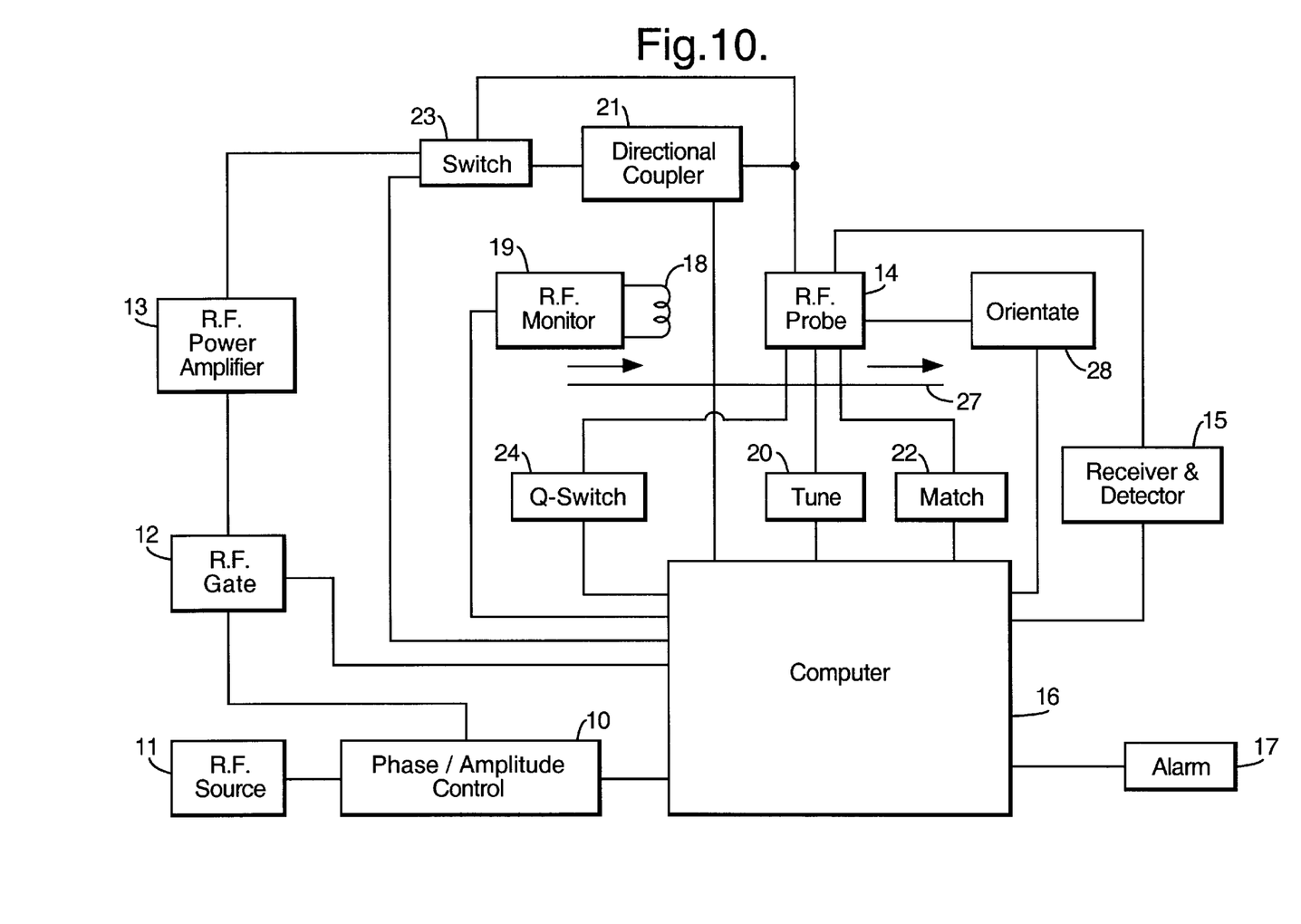
FIGS. 10 and 11 show preferred apparatus embodiments.

Referring to FIG. 10, apparatus for NQR testing includes a radio-frequency (rf) source 11 connected via a phase/amplitude control 10 and a gate 12 to an rf power amplifier 13. The output of the latter is connected to an rf probe 14. The probe is disposed about or adjacent the sample to be tested (not shown), such that the sample can be irradiated with rf pulses at the appropriate frequencies to excite nuclear quadrupole resonance in the substance under test (for example, an explosive). The rf probe 14 is also connected to rf receiver and detection circuitry 15 for detecting nuclear quadrupole resonance response signals.

The detected signal is sent from circuitry 15 to a control computer 16 (or other control apparatus) for processing. The computer includes some means 17 for producing an alarm signal in dependence upon whether a detected response corresponds to a predetermined response. The alarm signal would normally be used to activate an audio or visual alarm to alert the operator to the presence of the substance under test.

The control computer 16 also controls all pulses, their radio frequency, time, length, amplitude and phase. All of these parameters may need to be adjusted precisely; for example, phase may need to be varied in order to be able to generate echo responses. The computer also generates the predetermined response based on knowledge of the excitation frequencies, the system response, the environmental conditions and parameters such as the relaxation times of the substance to be detected. Shown in the diagram is control means 10 by which the computer may control the pulse amplitude and phase. The apparatus would normally be operated in the absence of an applied magnetic field.

The probe 14 is an open ended probe which is screened on all sides except for one, the unscreened side being used for applying excitation and detecting the response. The probe 14 comprises any of the antennas and associated circuitry described herein. Means 28 such as a motor is provided for adjusting the orientation of the antennas.

In this example the same probe is used for excitation and detection, although separate probes could also be used for these functions.

Figure 11:
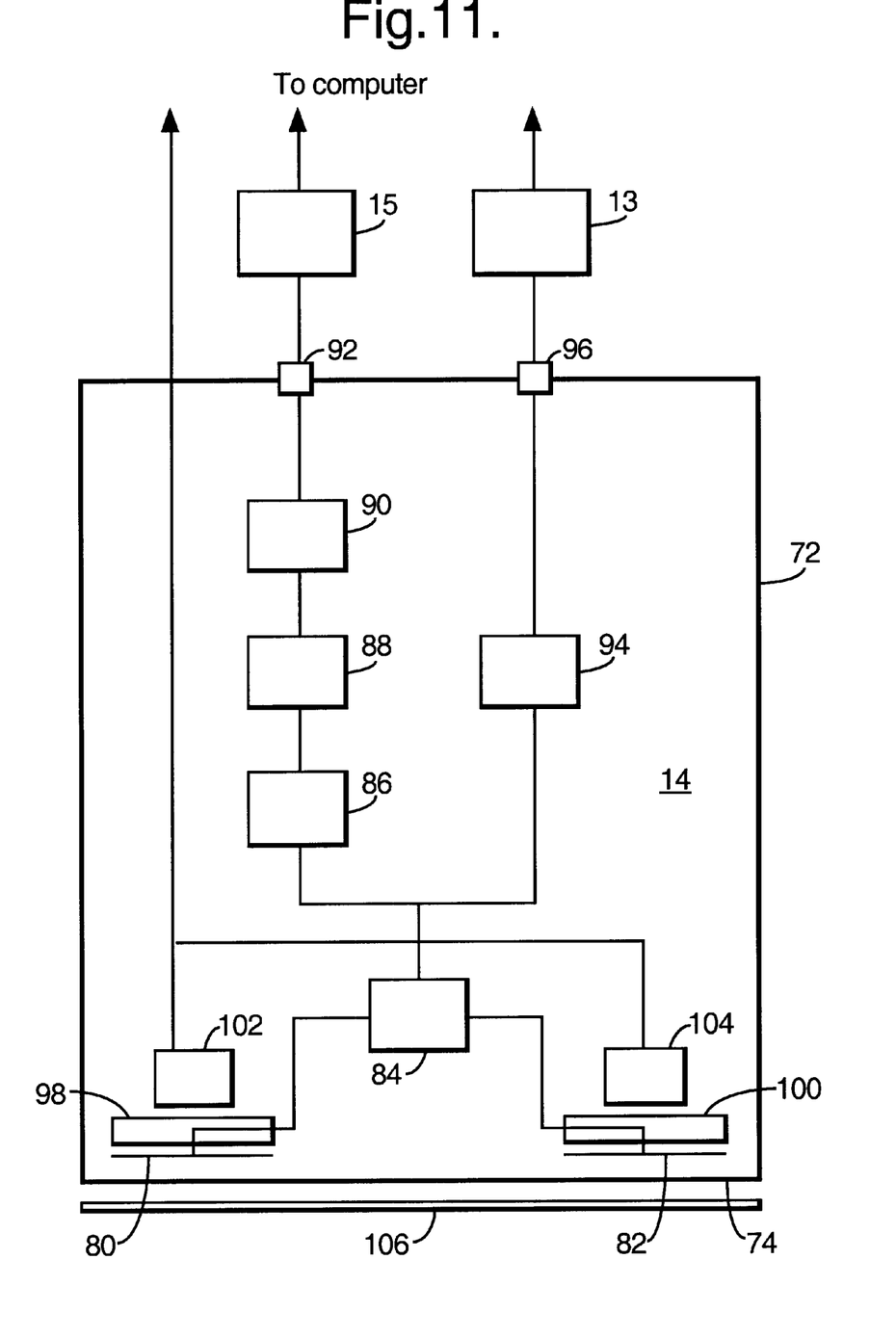

FIG. 11 shows a block diagram of a preferred arrangement of the rf probe 14. The probe comprises a copper cylinder 72 which is closed at one end and open at the other end, and contains the antennas and associated circuitry. A Perspex plate 74 is provided at the open end of the probe to protect the antennas.

A first antenna 80 is connected to a second antenna 82 via circuit 84, which may be any of the circuits described herein, such as a capacitor or a bridge circuit. The circuit 84 is connected via a quarter wavelength filter 86, crossed diodes to ground 88 and preamplifier circuit 90, to a connector 92 which provides a connection to receiver and detector 15. The circuit 84 is also connected via crossed diodes to ground 94 to a connector 96 which provides a connection to the power amplifier 13.

The antennas are mounted on respective Perspex (trademark) plates 98, 100. The Perspex plates have motors 102, 104 associated with them, which allow the orientations of the antennas to be adjusted under control of the computer (not shown).

Also shown FIG. 11 is a shield 106 for attenuating the electric field component of rf signals passing through it. The shield may be any of the shields describe herein, such as a slotted annular shield.

Suitable Pulse Sequences

The probe described herein may advantageously be used with phase cycled pulsed rf sequences to provide further rejection of spurious signals. Phase cycled pulsed rf sequences are described in International Patent Application Number WO 96/26453, acknowledged above.

U.S. Pat. No. 6,208,136 discloses efficient ways of discriminating against many kinds of spurious response by using a Spin Locking (SL) pulse or a Pulsed Spin Locking (PSL) sequence. The use of an SL pulse in phase cycling is taught in the first embodiment disclosed in that document, whilst the use of a PSL sequence is disclosed in the second embodiment.

A typical phase cycled sequence comprises two blocks, each block having its own preparation pulse, $P_1$, followed by a sequence of identical pulses, $P_2$, differing in phase by 90° from $P_1$. In a two-block sequence, block 1 is written in general terms as $$P\alpha_{+x} - \tau - (P\alpha_{+y} - 2\tau)_m - (P\alpha_{+y} - 2\tau)^{acq}_n$$

and block 2 is the phase-cycled version $$P\alpha_{-x} - \tau - (P\alpha_{+y} - 2\tau)_m - (P\alpha_{+y} - 2\tau)^{acq}_n$$

In this case the preparation pulse is followed by m pulses during which response signals are not acquired, and then n pulses during which response signals are acquired.

Alternatively, any of the sequences disclosed in co-pending patent application Ser. No. U.S. 09/549,722, the subject matter of which is incorporated herein by reference, may be used. The sequences disclosed in that application may be represented in general terms as

FIRST BLOCK—BRIDGING ELEMENT—SECOND BLOCK

The first block may comprise any of the following pulse sequences $$(P\alpha_{+y} - \tau)^{acq}_n$$

$$P\alpha_{+x} - \tau - (P\alpha_{+y} - 2\tau)_m - (P\alpha_{+y} - 2\tau)^{acq}_n$$

$$P\alpha_{+x} - 2\tau - (P\alpha_{+y} - 2\tau)_m - (P\alpha_{+y} - 2\tau)^{acq}_n$$

The bridging element may comprise any of the following elements $$\Delta$$

$$\Delta - P\theta_\phi$$

$$\Delta - (P180_{100} - \Delta)_n$$

or any combination thereof, where $\Delta$ is a delay, $\theta$ is an arbitrary flip angle and $\phi$ is arbitrary phase.

The second block may comprise any of the following pulse sequences $$(P\alpha_{-x} - \tau)^{acq}_n$$

$$P\alpha_{-x} - \tau - (P\alpha_{+y} - 2\tau)_m - (P\alpha_{+y} - 2\tau)^{acq}_n$$

$$P\alpha_{-x} - 2\tau - (P\alpha_{+y} - 2\tau)_m - (P\alpha_{+y} - 2\tau)^{acq}_n$$

Use of the pulse sequences outlined above may provide further rejection of spurious signals.

The present invention provides techniques for reducing interference in NQR response signals enabling the detection of otherwise obscured NQR signals in a way that could not be achieved by filtering.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. Apparatus for Nuclear Quadrupole Resonance testing a sample in the presence of interference comprising:
   excitation applying means for applying excitation;
   a first antenna for detecting a response to the excitation together with the interference; and
   a second antenna for detecting the interference;
   the first and second antennas being arranged such that a signal commonly detected in the two antennas is attenuated relative to a signal that is detected by only one of the antennas.

2. Apparatus according to claim 1 further comprising a screen located adjacent the first antenna, the screen being arranged to attenuate the electric component of an rf signal passing through the screen relative to the magnetic field component.

3. Apparatus according to claim 2 wherein the screen comprises a non-ferromagnetic metal.

4. Apparatus according to claim 2 wherein the screen is slotted.

5. Apparatus according to claim 2 wherein the screen is annular.

6. Apparatus according to claim 2 further comprising a second screen, of substantially the same type as said screen, located adjacent the second antenna.

7. Apparatus according to claim 1 wherein the excitation applying means is adapted to apply phase cycled pulse sequences.

8. Apparatus according to claim 1 for Nuclear Quadrupole resonance testing a sample comprising quadrupolar nuclei and which gives rise to spurious signals which interfere with response signals from the quadrupole nuclei, wherein:

the excitation applying means is adapted to apply a pulse sequence to the sample to excite nuclear quadrupole resonance, the pulse sequence comprising at least one pair of pulses;

the apparatus further comprises means for comparing, for the or each such pair, the respective response signals following each of the pair of pulses;

the pulse sequence is such that the respective spurious signals following the at least one pair of pulses is at least partially cancelled by the comparing means without the corresponding true quadrupole resonance signals being completed cancelled.

9. Apparatus according to claim 8 wherein for the or each such pair, the two member pulses are of like phase.

10. Apparatus according to claim 8 wherein for the or each such pair of pulses, a respective pulse preceding each member pulse of the pair is of differing phase.

11. Apparatus according to claim 8 wherein the or each such pair of pulses is of a first type, and the pulse sequence further comprises at least one further second type pair of pulses, corresponding to the or each first type pair, but having cycled phases.

12. Apparatus according to claim 1 wherein the excitation applying means comprises the first antenna, the first antenna being adapted to apply said excitation.

13. Apparatus according to claim 1 wherein the excitation applying means comprises the second antenna, the second antenna being adapted to apply excitation and to detect a response to that excitation.

14. Apparatus according to claim 1 wherein the first antenna comprises a first coil and the second antenna comprises a second coil, the first and second coils being wound in the opposite sense to each other.

15. Apparatus according to claim 14 wherein the two coils are connected in series.

16. Apparatus according to claim 14 wherein the two coils are connected in parallel.

17. Apparatus according to claim 1 wherein the first antenna is coupled to the second antenna via a balanced bridge circuit.

18. Apparatus according to claim 1 wherein the first antenna is coupled to the second antenna via a comparator circuit.

19. Apparatus according to claim 1 further comprising means for adjusting the relative orientation of the first and second antennas.

20. Apparatus according to claim 1 being an apparatus for detecting the presence of a substance containing a given species of quadrupolar nucleus.

21. Apparatus for Nuclear Quadrupole Resonance testing a sample in the presence of interference comprising;
   excitation applying device for applying excitation; a first antenna for detecting a response to the excitation together with the interference; and
   a second antenna for detecting the interference;
   the first and second antennas being arranged such that a signal commonly detected in the two antennas is attenuated relative to a signal that is detected by only one of the antennas.

* * * * *